United States Patent
Wakabayashi et al.

(10) Patent No.: US 9,880,463 B2
(45) Date of Patent: Jan. 30, 2018

(54) IMPRINT METHOD, IMPRINT APPARATUS, AND ARTICLE MANUFACTURING METHOD

(75) Inventors: Kohei Wakabayashi, Utsunomiya (JP); Hideki Matsumoto, Utsunomiya (JP); Fumio Sakai, Utsunomiya (JP); Makoto Mizuno, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 316 days.

(21) Appl. No.: 13/490,547

(22) Filed: Jun. 7, 2012

(65) Prior Publication Data

US 2012/0313293 A1    Dec. 13, 2012

(30) Foreign Application Priority Data

Jun. 10, 2011  (JP) .................... 2011-130620

(51) Int. Cl.
  *B28B 1/14* (2006.01)
  *B28B 13/02* (2006.01)
  *G03F 7/00* (2006.01)
  *B82Y 10/00* (2011.01)
  *B82Y 40/00* (2011.01)

(52) U.S. Cl.
  CPC ............ *G03F 7/0002* (2013.01); *B82Y 10/00* (2013.01); *B82Y 40/00* (2013.01)

(58) Field of Classification Search
  CPC ................................ G03F 7/0002; G03F 7/16
  USPC ....................................................... 264/299
  See application file for complete search history.

(56) References Cited

U.S. PATENT DOCUMENTS

| | | | |
|---|---|---|---|
| 7,343,857 B2 | 3/2008 | Sakuarai et al. | |
| 8,828,307 B2 | 9/2014 | Okushima et al. | |
| 8,946,093 B2 | 2/2015 | Mikami | |
| 2006/0192928 A1 | 8/2006 | Kasumi et al. | |
| 2006/0272535 A1 | 12/2006 | Seki et al. | |
| 2007/0237886 A1* | 10/2007 | Dijksman et al. ............... | 427/8 |
| 2008/0297748 A1 | 12/2008 | Smeets et al. | |

(Continued)

FOREIGN PATENT DOCUMENTS

| | | |
|---|---|---|
| JP | H01163201 A | 6/1989 |
| JP | 2007019466 A | 1/2007 |

(Continued)

OTHER PUBLICATIONS

Office Action issued in corresponding Japanese Patent Application No. 2011130620 dated Feb. 27, 2015.

(Continued)

*Primary Examiner* — Robert J Grun
(74) *Attorney, Agent, or Firm* — Rossi, Kimms & McDowell LLP

(57) ABSTRACT

A method of performing an imprint process on each of a plurality of shot regions of a substrate, wherein each shot region includes at least one of at least one valid chip area and at least one invalid chip area, the invalid chip area including an inhibited area in which resin coating is inhibited, the imprint process for a shot region including both the invalid chip area and the valid chip area includes coating the valid chip area of the shot region with the resin, bringing a pattern surface of a mold into contact with the resin, and curing the resin, and in the step of coating, at least the inhibited area of the invalid chip area is not coated with the resin.

8 Claims, 4 Drawing Sheets

(56) References Cited

U.S. PATENT DOCUMENTS

| | | |
|---|---|---|
| 2009/0098479 A1 | 4/2009 | Sykes et al. |
| 2009/0200710 A1 | 8/2009 | Khusnatdinov et al. |
| 2009/0224436 A1 | 9/2009 | Mikami et al. |
| 2011/0267595 A1 | 11/2011 | Mori |
| 2012/0149211 A1 | 6/2012 | Ojima |
| 2012/0208327 A1 | 8/2012 | Matsuoka |
| 2014/0027955 A1 | 1/2014 | Wakabayashi et al. |

FOREIGN PATENT DOCUMENTS

| | | |
|---|---|---|
| JP | 2011521438 A | 7/2011 |
| JP | 2011161832 A | 8/2011 |
| JP | 2012089190 A | 5/2012 |
| JP | 2012169475 A | 9/2012 |
| JP | 2012199329 A | 10/2012 |
| JP | 2013069919 A | 4/2013 |
| KR | 1020070100963 A | 10/2007 |
| KR | 1020090130294 A | 12/2009 |
| WO | 2009099666 A1 | 8/2009 |

OTHER PUBLICATIONS

Office Action issued in Taiwanese Application No. 102125384 dated Dec. 21, 2015. English translation provided. Cited in copending U.S. Appl. No. 13/949,772 (Publication No. US 2014-0027955).

Office Action issued in Korean Application No. 10-2013-0085927 dated Jan. 14, 2016. Cited in copending U.S. Appl. No. 13/949,772 (Publication No. US 2014-0027955).

Office Action issued in Japanese Application No. 2012-164085 dated Jun. 6, 2016. Cited in copending U.S. Appl. No. 13/949,772 (Publication No. US 2014-0027955).

Office Action issued in copending U.S. Appl. No. 13/949,772 dated May 19, 2016.

Office Action issued in copending U.S. Appl. No. 13/949,772 dated Dec. 9, 2016.

* cited by examiner

F I G. 1
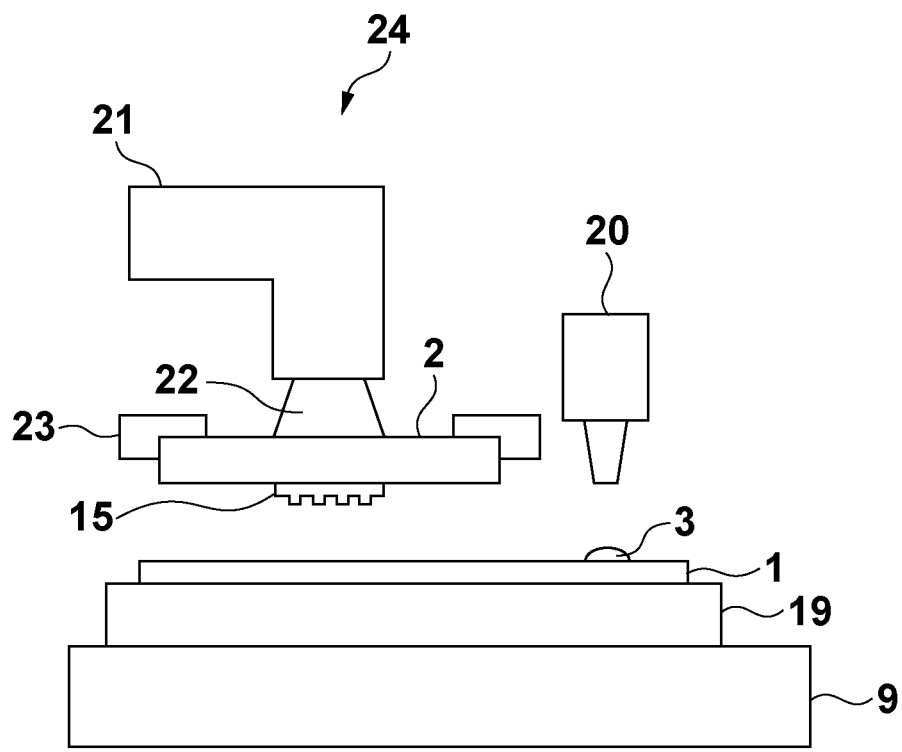

IMPRINT METHOD, IMPRINT APPARATUS, AND ARTICLE MANUFACTURING METHOD

BACKGROUND OF THE INVENTION

Field of the Invention

The present invention relates to an imprint method, imprint apparatus, and article manufacturing method.

Description of the Related Art

An imprint method including three modes for a peripheral shot region including the outer periphery of a substrate is described in Japanese Patent Laid-Open No. 2007-019466. In the first mode, no imprint process is performed on the peripheral shot region. In the second mode, an imprint process is performed on the peripheral shot region by using a mold to be used to imprint an inner shot region not including the outer periphery of the substrate. In the third mode, the imprint process is performed on the peripheral shot region by using a mold different from the mold to be used to imprint the inner shot region, and corresponding to the shape of the peripheral shot region.

The shot region normally includes a plurality of chip areas. In the first mode, the yield is low because no chip pattern is formed in the peripheral shot region. In the second mode, chip patterns are effectively transferred to a chip area (valid chip area) positioned in the peripheral shot region and not including the outer periphery of the substrate, and only chip patterns transferred to a chip area (invalid chip area) including the outer periphery of the substrate are invalidated. Accordingly, the second mode is superior to the first mode in yield. In the second mode, the peripheral shot region is imprinted by using the mold to be used to imprint the inner shot region, so the entire peripheral shot region is presumably coated with a resin (the resin is presumably dispensed on the entire peripheral shot region). When performing the imprint process on the peripheral shot region in this state, the resin dispensed on the invalid chip area positioned in the periphery of the substrate may be pushed outside the substrate from between the mold and substrate. Since an imprint apparatus is an apparatus for transferring micropatterns onto a substrate, the reliability decreases if the pushed resin adheres to the mold or a substrate holding unit. Especially when the resin adheres to the mold, a pattern defect is highly likely to occur.

In the third mode, the imprint process is performed on the peripheral shot region by using a mold having a shape corresponding to the peripheral shot region, because if the mold for the inner shot region is used, the mold may be damaged by stress concentration or the like. The imprint process for the peripheral region in the third mode is performed to improve the uniformity of the whole substrate in processes such as dry etching and ion implantation. In addition, this imprint process is not separately performed for the valid chip area and invalid chip area. Also, if the imprint process for the peripheral region is performed by coating the entire peripheral shot region with a resin, the resin may be pushed outside the substrate from between the mold and substrate and cause a pattern defect as in the second mode. Furthermore, in the third mode, when the shape of the peripheral shot region is changed in accordance with, for example, the shot layout of the inner shot region, it is necessary to prepare a new peripheral shot region mold corresponding to the changed shape. Therefore, the third mode requires a high cost in order to prepare a number of peripheral shot region molds.

SUMMARY OF THE INVENTION

The present invention provides an imprint technique capable of preventing a pattern defect and increasing the yield at the same time.

The present invention in its one aspect provides an imprint method of performing an imprint process on each of a plurality of shot regions of a substrate, wherein each shot region includes at least one of at least one valid chip area from which a valid chip is obtained because an outer periphery of the chip area does not include an outer periphery of the substrate, and at least one invalid chip area from which no valid chip is obtained because an outer periphery of the chip area includes the outer periphery of the substrate, the invalid chip area including an inhibited area in which resin coating is inhibited over a predetermined distance from the outer periphery of the substrate, the imprint process for a shot region including both the invalid chip area and the valid chip area includes a step of coating the valid chip area of the shot region with the resin, a step of bringing a pattern surface of a mold into contact with the resin with which each valid chip area is coated, and a step of curing the resin while the resin and the pattern surface are in contact with each other, and in the step of coating, at least the inhibited area of the invalid chip area is not coated with the resin.

Further features of the present invention will become apparent from the following description of exemplary embodiments with reference to the attached drawings.

BRIEF DESCRIPTION OF THE DRAWINGS

FIG. 1 is a view showing an imprint apparatus.

DESCRIPTION OF THE EMBODIMENTS

Figure 2:
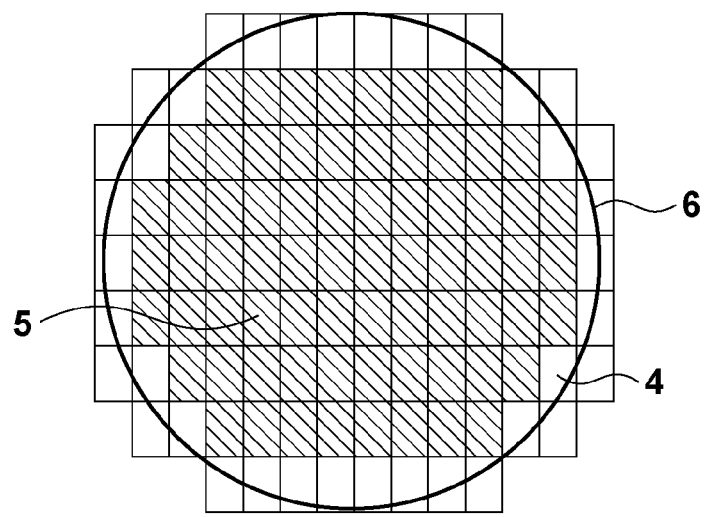
FIG. 2 is a view showing shot regions.

Embodiments of the present invention will be explained in detail below with reference to the accompanying drawings.

<Imprint Apparatus>

FIG. 1 shows an imprint apparatus 24. A substrate holding unit 19 holds a substrate 1, and a mask holding unit 23 holds a mask 2. A pattern surface 15 of the mask (mold) 2 having patterns is pressed against the substrate 1 coated with an uncured resin 3 by a coating unit 20 (an imprint operation), thereby filling the uncured resin in recesses of the pattern surface 15 of the mask 2. In this state, the resin 3 is cured by radiating light 22 that cures the resin 3 by an irradiation unit 21 (an exposure operation), and the mask 2 is released from the resin 3 (a mold release operation). A driving unit 9 horizontally moves the substrate 1, and the series of imprint processes are repeated in order for a plurality of shot regions, thereby forming patterns based on the three-dimensional shape of the pattern surface 15 of the mask 2 in each shot region of the substrate 1. A controller (not shown) controls the operations of the substrate holding unit 19, mask holding unit 23, coating unit 20, and irradiation unit 21.

<Shot Region and Edge Shot Region>

FIG. 2 shows shot regions on the substrate 1. Each shot region is a rectangle and includes a plurality of chip areas. A shot region 4 indicated by a white portion and having an outer periphery including an outer periphery 6 of the substrate 1 is called "an edge shot region". A shot region 5 indicated by a hatched portion and having an outer periphery not including the outer periphery 6 of the substrate 1 is called "a non-edge shot region". That is, the shot regions on the substrate 1 include the edge shot regions 4 and non-edge shot regions 5.

<Valid Chip Area 8 and Invalid Chip Area 7>

Figure 3:
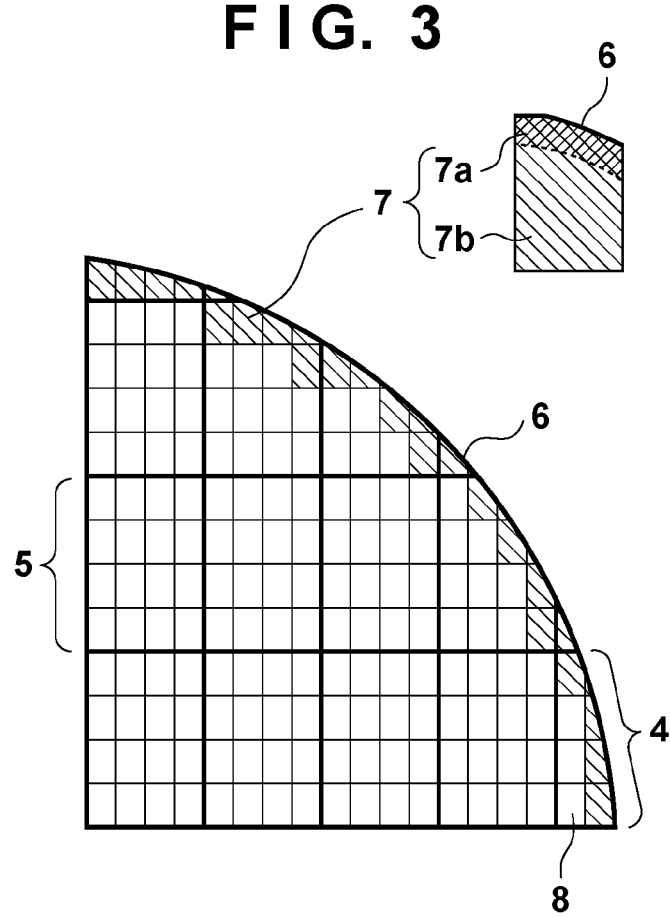
FIG. 3 is a view showing valid chip areas, invalid chip areas, and an inhibited area.

FIG. 3 is a partially enlarged view of the substrate 1 including the edge shot regions 4. Of chip areas on the substrate 1, a chip area 7 from which no valid chip can be obtained because the outer periphery of the chip area includes the outer periphery 6 of the substrate 1 is called "an invalid chip area". A chip area 8 from which a valid chip can be obtained because the outer periphery of the chip area does not include the outer periphery 6 of the substrate 1 is called "a valid chip area". Referring to FIG. 3, each rectangle (thin lines) indicates a chip area, and a region including a plurality of chip areas and indicated by thick lines is a shot region. One shot region 5 includes a plurality of (in the non-edge shot region 5 in FIG. 3, 16) chip areas. White portions indicate the valid chip areas 8, and hatched portions indicate the invalid chip areas 7. All chip areas in the non-edge shot region 5 are the valid chip areas 8. On the other hand, the edge shot regions 4 include a shot region (the lower right shot region in FIG. 3) in which both the invalid chip areas 7 and valid chip areas 8 exist, and a shot region (the upper left shot region in FIG. 3) in which all areas are the invalid chip areas 7. The invalid chip area 7 includes an inhibited area 7a in which resin coating is inhibited over a predetermined distance from the outer periphery 6 of the substrate 1.

First Embodiment

The first embodiment will be explained. In the non-edge shot region 5 in which no invalid chip area 7 exists and only the valid chip areas 8 exist, all areas in the shot region are coated with the resin 3. On the other hand, in the edge shot region 4 in which the valid chip areas 8 and invalid chip areas 7 coexist, only the valid chip areas 8 are coated with the resin 3. The edge shot region 4 including only the invalid chip areas 7 is not coated with the resin 3. An imprint process including an imprint operation, exposure operation, and mold release operation is performed on the coated valid chip area 8, thereby forming patterns on the valid chip area 8.

Figure 4A:
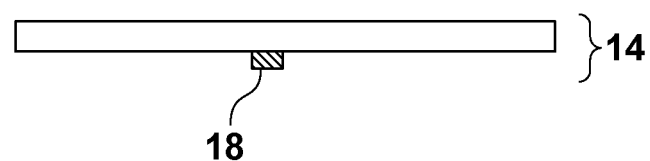
FIGS. 4A and 4B are views showing a sub mask of the first embodiment.
Figure 4B:
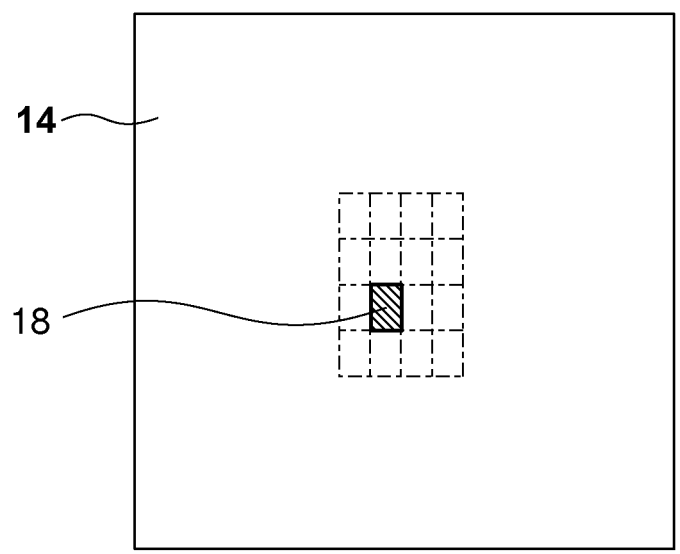

The imprint process is performed on the non-edge shot region 5 by using the mask 2 (a first mold) which has a pattern surface corresponding to the size of the non-edge shot region 5, and forms patterns in each non-edge shot region 5. On the other hand, the imprint process is performed on the valid chip area 8 of the edge shot region 4 by using a sub mask 14 (a second mold), shown in FIGS. 4A and 4B, which has a pattern surface 18 corresponding to the size of the valid chip area 8, and forms patterns in each valid chip area 8.

The imprint process is first performed on each non-edge shot region 5, and then performed on each valid chip area in the edge shot region 4. When performing the imprint process on an area 7b in the invalid chip area 7, this imprint process on the area 7b is performed after the imprint process is performed on valid chip areas in the non-edge shot regions 5 and edge shot regions 4.

Second Embodiment

Figure 5A:
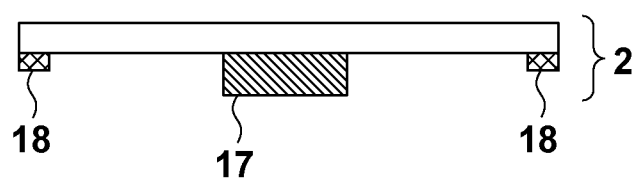
FIGS. 5A and 5B are views showing a mask of the second embodiment.
Figure 5B:
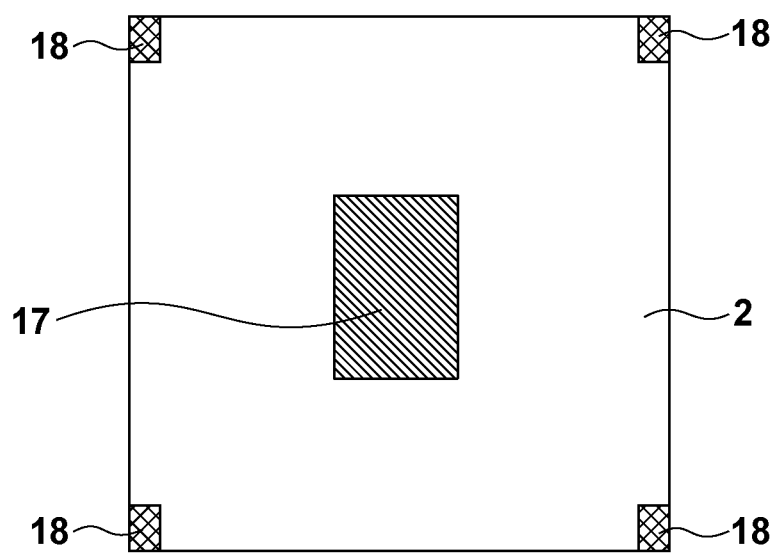

In the first embodiment, the mask 2 to be used in the imprint process of the non-edge shot region 5 is different from the sub mask 14 to be used in the imprint process of valid chip areas in the edge shot region 4. In the second embodiment, the mask 2 is used as a mask to be used in the imprint process of the non-edge shot region 5, and as a mask to be used in the imprint process of valid chip areas in the edge shot region 4. The mask 2 of the second embodiment has a first pattern surface 17 for forming patterns in each non-edge shot region 5, and second pattern surfaces 18 for forming patterns in each valid chip area 8. FIG. 5A shows the mask 2 having the first pattern surface 17 and second pattern surfaces 18. FIG. 5A shows the side surface of the mask 2, and FIG. 5B shows the front surface of the mask 2. As shown in FIG. 5A, a difference is produced between the heights of the first pattern surface 17 and second pattern surfaces 18 so that the second pattern surfaces 18 do not contact the substrate 1 when the first pattern surface 17 contacts the substrate 1. The second pattern surfaces 18 are arranged at the corners of the mask 2.

OTHER EMBODIMENTS

In the first and second embodiments, the imprint process is performed by coating only the valid chip areas 8 with the resin 3, without coating the invalid chip areas 7 with the resin 3. When performing the imprint process, however, it is also possible to coat, with the resin 3, all the valid chip areas 8 and the area 7b except for the inhibited area 7a of the invalid chip area 7, without coating the inhibited area 7a with the resin 3. Coating the area 7b with the resin in the invalid chip area 7 from which no valid chip can be obtained has the following technical meaning. In processes such as dry etching and ion implantation that are affected by the density and size of surrounding patterns, the invalid chip area 7 including the outer periphery 6 of the substrate has a function of improving the uniformity of the etching amount and implantation amount. Therefore, the area 7b except for the inhibited area 7a of the invalid chip area 7 can be coated with the resin 3, so that the resin 3 exists even in the invalid chip area 7 while the resin 3 is not pushed outside the substrate 1.

The invalid chip area 7 also functions as test patterns in other processes, so it is sometimes desirable to form patterns even in the invalid chip area 7b coated with the resin. The sub mask 14 is used in the imprint process for the area 7b. The spread of the resin 3 is monitored by using an image detector capable of observing the spread of the resin 3, and the resin 3 is cured by exposure before the resin 3 leaks. This makes it possible to reliably prevent the resin 3 from being pushed outside the substrate 1 by the imprint process for the area 7b. Alternatively, the resin 3 can be cured by exposure before it leaks by premeasuring a time required for the resin to leak from the substrate 1.

Note that the sub mask for forming patterns in the area 7b of the invalid chip area 7 can be different from the sub mask 14 for forming patterns in the valid chip area 8, and the pattern surface can be a smooth flat surface. Although the area 7b of the invalid chip area 7 is coated with the resin 3, the resin 3 may also be cured by irradiation with exposure light 22 without bringing the mask into contact with the resin 3. Furthermore, when coating the area 7b of the invalid chip area 7 with the resin 3, the coating density of the resin 3 can be decreased toward the inhibited area 7a.

[Article Manufacturing Method]

A method of manufacturing a device (for example, a semiconductor integrated circuit device or liquid crystal display device) as an article includes a step of transferring (forming) patterns onto a substrate (wafer, glass plate, or film-like substrate) by using the above-described imprint apparatus. This manufacturing method can further include a step of etching the substrate on which the patterns are transferred. Note that when manufacturing another article such as a patterned medium (recording medium) or optical element, the manufacturing method can include another step of processing the substrate on which the patterns are transferred, instead of the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-130620 filed Jun. 10, 2011 which is hereby incorporated by reference herein in its entirety.

What is claimed is:

1. An imprint method of performing an imprint process on each of a plurality of shot regions of a substrate, wherein:
   the plurality of shot regions include a peripheral shot region that includes an outer periphery of the substrate and a non-peripheral shot region that does not include the outer periphery of the substrate,
   the peripheral shot region includes a valid chip area from which a valid chip is obtained and an invalid chip area from which no valid chip is obtained,
   the invalid chip area includes a first area and a second area,
   the first area captures an uncured resin that becomes pushed outwardly toward the outer periphery of the substrate when a mold and the uncured resin are contacted with each other, and includes the outer periphery of the substrate,
   the second area is located at an inner side of the first area, and
   for the imprint process for the peripheral shot region, the method comprises:
   a supplying step of supplying the uncured resin to the second area, without supplying the uncured resin to the first area;
   a contacting step of bringing a pattern surface of the mold into contact with the uncured resin on the peripheral shot region;
   a curing step of curing the resin while the uncured resin and the pattern surface are in contact with each other; and
   a releasing step of releasing the pattern surface of the mold from the resin cured in the curing step.

2. The method according to claim 1, wherein:
   the mold includes a first mold that forms a pattern in the non-peripheral shot region and a second mold that forms a pattern in the peripheral shot region, and
   the imprint process is performed on the non-peripheral shot region using the first mold, and
   the imprint process is performed on the peripheral shot region using the second mold.

3. The method according to claim 1, wherein:
   the mold has a first pattern surface that forms a pattern in the non-peripheral shot region and a second pattern surface that forms a pattern in the peripheral shot region, and
   the imprint process is performed on at least the non-peripheral shot region using the first pattern surface, and
   the imprint process is performed on the peripheral shot region using the second pattern surface.

4. An article manufacturing method comprising:
   a pattern forming step of forming a pattern on a substrate by performing an imprint process on each of a plurality of shot regions of the substrate according to the method of claim 1; and
   a processing step of processing the substrate on which the pattern is formed in the pattern forming step, to manufacture the article.

5. The imprint method according to claim 1, wherein the first area is ring shaped corresponding to the outer periphery of the substrate.

6. The imprint method according to claim 1, wherein:
   the mold includes a flat surface,
   the contacting step contacts part of the uncured resin on the peripheral shot region with the flat surface.

7. An imprint method of performing an imprint process on each of a plurality of shot regions of a substrate, wherein:
   the plurality of shot regions include a peripheral shot region that includes an outer periphery of the substrate and a non-peripheral shot region that does not include the outer periphery of the substrate,
   the peripheral shot region includes a valid chip area from which a valid chip is obtained and an invalid chip area from which no valid chip is obtained,
   the invalid chip area including a first area and a second area,
   the first area captures an uncured resin that becomes pushed outwardly toward the outer periphery of the substrate when a mold and the uncured resin are contacted with each other, and includes the outer periphery of the substrate,
   the second area is located at an inner side of the first area, and
   for the imprint process for the peripheral shot region, the method comprises:
   a supplying step of supplying the uncured resin to the non-peripheral shot region and the second area, without supplying the first area with the uncured resin;
   a contacting step of bringing a pattern surface of the mold into contact with the uncured resin on the peripheral shot region;
   a curing step of curing the resin while the uncured resin and the pattern surface are in contact with each other; and
   a releasing step of releasing the pattern surface of the mold from the resign resin cured in the curing step,
   wherein the supplying step supplies the uncured resin on the substrate with a decreased amount of density of the uncured resin toward the first area.

8. An article manufacturing method comprising:
   a pattern forming step of forming a pattern on a substrate by performing an imprint process on each of a plurality of shot regions of the substrate according to the method of claim 7; and
   a processing step of processing the substrate on which the pattern is formed in the pattern forming step, to manufacture the article.

* * * * *